United States Patent
Bilyalov et al.

(10) Patent No.: US 7,705,235 B2
(45) Date of Patent: Apr. 27, 2010

(54) PHOTOVOLTAIC DEVICE

(75) Inventors: Renat Bilyalov, Tielt-Winge (BE); Alexander Ulyashin, Hagen (DE); Jef Poortmans, Kessel-Lo (BE); Wolfgang Fahrner, Hagen (DE)

(73) Assignees: IMEC, Leuven (BE); FernUniversitat Hagen, Hagen (DE)

( * ) Notice: Subject to any disclaimer, the term of this patent is extended or adjusted under 35 U.S.C. 154(b) by 1034 days.

(21) Appl. No.: 10/658,114

(22) Filed: Sep. 8, 2003

(65) Prior Publication Data

US 2004/0103937 A1    Jun. 3, 2004

Related U.S. Application Data

(60) Provisional application No. 60/412,101, filed on Sep. 19, 2002.

(30) Foreign Application Priority Data

Sep. 9, 2002    (EP) .................................. 02447171

(51) Int. Cl.
*H01L 31/00* (2006.01)

(52) U.S. Cl. .................. 136/255; 136/244; 136/246; 136/258; 136/259; 136/261; 257/431; 257/461; 257/464

(58) Field of Classification Search .................. 136/244, 136/246, 255, 258, 259, 261; 257/1–798
See application file for complete search history.

(56) References Cited

U.S. PATENT DOCUMENTS

| 5,066,340 | A | * | 11/1991 | Iwamoto et al. | 136/258 |
| 5,213,628 | A | | 5/1993 | Noguchi et al. | |
| 5,272,355 | A | * | 12/1993 | Namavar et al. | 257/3 |
| 5,331,180 | A | * | 7/1994 | Yamada et al. | 257/3 |
| 5,644,156 | A | * | 7/1997 | Suzuki et al. | 257/485 |
| 5,757,024 | A | * | 5/1998 | Fathauer et al. | 257/19 |
| 6,399,177 | B1 | * | 6/2002 | Fonash et al. | 428/119 |
| 6,683,367 | B1 | * | 1/2004 | Stalmans et al. | 257/618 |

FOREIGN PATENT DOCUMENTS

JP    03-235371    10/1991
JP    03-235371    1/1992

(Continued)

OTHER PUBLICATIONS

Berger et al., "Porosity superlattices: a new class of Si heterostructures", J. Phys. D: Appl. Phys. 27 (1994), pp. 1333-1336.*

(Continued)

*Primary Examiner*—Basia Ridley
*Assistant Examiner*—Thanh-Truc Trinh
(74) *Attorney, Agent, or Firm*—Knobbe Martens Olson & Bear LLP

(57) ABSTRACT

The present invention is related to a photovoltaic device, the device comprising a first layer of a first semiconductor material of a first conductivity type, a second layer of a second semiconductor material of the opposite conductivity type of the first layer, and a third layer of a third porous semiconductor material situated between the first layer and the second layer. The present invention also provides a method for producing the photovoltaic device.

27 Claims, 10 Drawing Sheets

FOREIGN PATENT DOCUMENTS

JP    05-283723    2/1994

OTHER PUBLICATIONS

Bilyalov, et al., Porous silicon as an intermediate layer for thin-film solar cell, Solar Energy Materials and Solar Cells, Elsevier Science Publishers, Amsterdam, vol. 65, No. 1-4, Jan. 2001, pp. 477-485.

Jin, et al., "Transmission electron microscopy investigation of the crystallographic quality of silicon films grown epitaxially on porous silicon", Journal of Crystal Growth, North-Holland Publishing Co., Amsterdam, vol. 212, No. 1-2, 2000, pp. 119-127.

Chang, et al., "Study and Fabrication of Pin Photodiode by using ZnSe/Ps/Si Structure", IEEE Transactions on Electron Devices, IEEE Inc., New York, vol. 47, No. 1, Jan. 1, 2000, pp. 50-54.

Rubino, et al., "Amorphous/porous heterojunction on thin microcrystalline silicon", Journal of Non-Crystalline Solids, North-Holland Publishing Co., Amsterdam, vol. 266-269, May 2000, pp. 1044-1048.

Yerokhov, et al., "Porous silicon in solar cell structures: a review of achievements and modern directions of further use", Renewable and Sustainable Energy Reviews, Elseviers Science, New York, vol. 3, No. 4, Dec. 1999, pp. 291-322.

Palsule, et al., "Electrical and optical characterization of crystalline silicon/porous silicon heterojunctions", Solar Energy Materials and Solar Cells, Elsevier Science Publishers, Amsterdam, vol. 46, No. 4, Jul. 1, 1997, pp. 261-269.

European Search Report for Application No. EP 03 44 7226 (mailed Dec. 15, 2003).

Bilyalov, et al., Solar Energy Materials and Solar Cells, 65 (2001) 477-485.

Jin, et al., Journal of Crystal Growth, 212 (2000), 119-127.

Chang, et al., IEEE Transactions on Electron Devices, vol. 47, No. 1, Jan. 2000.

Rubino, et al., Journal of Non-Crystalline Solids, 266-269 (2000), 1044-1048.

Bilyalov, et al., Conference Record of the Twenty-Eighth IEEE Photovoltaic Specialists Conference—2000, Cat. No. 00CH37036, xxxii+1838, 291-294.

Sawada, et al., first World Conference on Photovoltaic Energy Conversion, Hawaii, 1994, 1219-1226.

* cited by examiner

US 7,705,235 B2

PHOTOVOLTAIC DEVICE

RELATED APPLICATION

This application claims the benefit of U.S. Provisional Application No. 60/412,101 filed Sep. 19, 2002.

FIELD OF THE INVENTION

The present invention is related to the field of photovoltaic devices.

BACKGROUND OF THE INVENTION

Within photovoltaic research, one strives to develop cost-effective solar cells which provide a high efficiency. The costs for producing, for instance, silicon material-based solar cells can be categorized as follows: material costs, which make up the biggest part of overall costs and which are strongly dependent on the quality of the used silicon, which is a function of its grain size; solar cell process costs; and module process costs.

HIT (Heterojunction with Intrinsic Thin-layer) cells are state of the art and were developed to improve the junction properties of the classical heterojunction cell.

U.S. Pat. No. 5,213,628 describes a photovoltaic device including an intrinsic amorphous semiconductor layer formed on a monocrystalline or polycrystalline semiconductor layer of specified conductivity type, on which an amorphous semiconductor layer of the opposite conductivity type is formed.

U.S. Pat. No. 5,066,340 describes a photovoltaic device including a crystalline silicon semiconductor layer of a specified conductivity type material, an amorphous silicon semiconductor layer of the opposite conductivity type, and an intrinsic microcrystalline silicon semiconductor layer between these two layers.

"Porous Silicon as an intermediate layer for thin-film solar cell" to Bilyalov, et al., Solar Energy Materials & Solar Cells, 65 (2001) 477-485, describes the use of a dual porous silicon layer as an intermediate layer for thin-film solar cells. The porous layer has a thickness of 400 to 700 nm and serves as a seeding layer for epitaxial growth of silicon. The dual porous layer can be used for the lift-off process. In both cases, the porous layer is used outside of the active area of the solar cell device. "Transmission electron microscopy investigation of the crystallographic quality of silicon films grown epitaxially on porous silicon" to Jin et al., Journal of Crystal Growth, 212 (2000) 119/127, describes a porous layer having a thickness of 220 nm for the same purpose.

Japanese Patent Application No. 03-235371 describes the use of an intermediate porous layer to reduce the lattice mismatch between a GaAs layer and a Si layer to reduce lattice defects. A porous layer having a thickness of larger than 100 nm is described.

"Study and fabrication of PIN Photodiode by using ZnSe/PS/Si Structure" to Chang et al., IEEE Transactions on Electron Devices, Vol. 47, No. 1, January 2000, describes a photodiode or photodetector based on a compound material (ZnSe) and a porous silicon layer, which is used to allow high quality growth of ZnSe on a Si/porous Si structure.

"Amorphous/porous heterojunction on thin microcrystalline silicon" to Rubino, et al., Journal of Non-Crystalline Solids, 266-269 (2000) 1044-1048, describes the use of a porous layer in a LED device. An amorphous Silicon/porous silicon on microcrystalline silicon structure is disclosed. The porous Si layer is used for photoluminescence (LED), and has a thickness of 400 nm to 1500 nm.

SUMMARY OF THE INVENTION

A solar cell is provided which combines a high efficiency and a low price.

In a first embodiment of the invention, a photovoltaic device is provided, the device including: a first layer including a first semiconductor material including a first conductivity type; a second layer including a second semiconductor material of a second opposite conductivity type, wherein the second conductivity type is opposite the first conductivity type; and a third layer including a third semiconductor material, wherein the third layer is situated between the first layer and the second layer, wherein the third layer includes a porous layer, wherein the third layer includes a translucent layer, and wherein the third layer includes a diffusion barrier.

In an aspect of the first embodiment, the third layer includes a thickness of from about 1 nm to about 50 nm.

In an aspect of the first embodiment, the third layer includes a thickness of from about 1 nm to about 10 nm.

In an aspect of the first embodiment, the third layer includes a thickness of from about 5 nm to about 10 nm.

In an aspect of the first embodiment, the photovoltaic device includes a device selected from the group consisting of a photodiode, a photoresistor, and a solar cell.

In an aspect of the first embodiment, the first semiconductor material, the second semiconductor material, and the third semiconductor material include a same semiconductor material.

In an aspect of the first embodiment, the first semiconductor material, the second semiconductor material, and the third semiconductor material include a same element or a same combination of elements.

In an aspect of the first embodiment, the first semiconductor material, the second semiconductor material, and the third semiconductor material are selected from the group consisting of Si, Ge, and GaAs.

In an aspect of the first embodiment, the first semiconductor material, the second semiconductor material, and the third semiconductor material include silicon.

In an aspect of the first embodiment, the second semiconductor material and the third semiconductor material include a same semiconductor material.

In an aspect of the first embodiment, the second semiconductor material and the third semiconductor material include a same element or a same combination of elements.

In an aspect of the first embodiment, the second semiconductor material and the third semiconductor material are selected from the group consisting of Si, Ge, and GaAs.

In an aspect of the first embodiment, the first semiconductor material and the third semiconductor material include a same semiconductor material.

In an aspect of the first embodiment, the first semiconductor material and the third semiconductor material include a same element or a same combination of elements.

In an aspect of the first embodiment, the first semiconductor material and the third semiconductor material are selected from the group consisting of Si, Ge, and GaAs.

In an aspect of the first embodiment, the first semiconductor material and the second semiconductor material include a same semiconductor material.

In an aspect of the first embodiment, the first semiconductor material and the second semiconductor material include a same element or a same combination of elements.

In an aspect of the first embodiment, the first semiconductor material and the second semiconductor material are selected from the group consisting of Si, Ge, and GaAs.

In an aspect of the first embodiment, the third semiconductor material includes a non-doped semiconductor material.

In an aspect of the first embodiment, the third semiconductor material includes a crystalline semiconductor material.

In an aspect of the first embodiment, the third layer includes a material selected from the group consisting of a multicrystalline semiconductor material and a monocrystalline semiconductor material.

In an aspect of the first embodiment, the second layer includes a crystalline semiconductor material.

In an aspect of the first embodiment, the second layer includes a material selected from the group consisting of a monocrystalline semiconductor material and a multicrystalline semiconductor material.

In an aspect of the first embodiment, the first layer includes a thickness of from about 3 nm to about 100 nm.

In an aspect of the first embodiment, the device further includes an amorphous silicon layer, wherein the amorphous silicon layer is situated between the first layer and the third layer.

In an aspect of the first embodiment, the device further includes a fourth layer, wherein the second layer is attached to the fourth layer, wherein the fourth layer includes a porous layer including a fourth semiconductor material, and wherein the fourth semiconductor material includes non-doped crystalline silicon semiconductor material.

In an aspect of the first embodiment, the device further includes a fifth layer, wherein the fourth layer is attached to the fifth layer, wherein the fourth layer and the fifth layer include a same conductivity type, and wherein the fifth layer includes a material selected from the group consisting of amorphous silicon semiconductor material, nanocrystalline semiconductor material, and microcrystalline silicon semiconductor material.

In an aspect of the first embodiment, the second layer includes a plurality of macro etch pits including a diameter of greater than about one micron, and wherein a portion of the macro etch pits include a plurality of fine etch pits including a diameter of less than about one micron.

In a second embodiment of the invention, a method for fabricating a photovoltaic device is provided, the method including the steps of: providing a second layer including a second semiconductor material including a second conductivity type; fabricating or depositing a third layer including a third semiconductor material on the second layer, wherein the third layer includes a porous layer, wherein the third layer includes a translucent layer, and wherein the third layer includes a diffusion barrier; and fabricating or depositing a first layer on the third layer, wherein the first layer includes a first semiconductor material including a first conductivity type, and wherein the second conductivity type is opposite the first conductivity type.

In an aspect of the second embodiment, the method further includes the step of texturing the surface of said second layer, wherein the step of texturing is conducted before the step of fabricating or depositing the third layer.

In an aspect of the second embodiment, the step of texturing the surface includes acid etching the surface.

In an aspect of the second embodiment, the third layer includes a thickness of from about 1 nm to about 50 nm.

In an aspect of the second embodiment, the third layer includes a thickness of from about 1 nm to about 10 nm.

In an aspect of the second embodiment, the third layer includes a thickness of from about 5 nm to about 10 nm.

In a third embodiment of the invention, a method for fabricating a photovoltaic device is provided, the the method including the steps of: providing a second layer including a second semiconductor material including a second conductivity type; fabricating or depositing a fourth layer on the second layer, wherein the fourth layer includes a fourth semiconductor material, wherein the fourth layer includes a porous layer, and wherein the fourth semiconductor material includes a non-doped crystalline silicon semiconductor material; fabricating or depositing a fifth layer on the fourth layer, wherein the fifth layer includes a material selected from the group consisting of amorphous silicon semiconductor material, nanocrystalline semiconductor material, and microcrystalline silicon semiconductor material, wherein the fourth layer and the fifth layer include a same conductivity type; fabricating or depositing a third layer on the fifth layer, wherein the third layer includes a porous layer, the third layer including a third semiconductor material, wherein the third layer includes a translucent layer, and wherein the third layer includes a diffusion barrier; and fabricating or depositing a first layer on the third layer, wherein the first layer includes a first semiconductor material including a first conductivity type, and wherein the second conductivity type is opposite the first conductivity type.

In a fourth embodiment of the invention, a method for fabricating a photovoltaic device is provided, the the method including the steps of: providing a second layer including a second semiconductor material including a second conductivity type; fabricating or depositing a third layer including a third semiconductor material on the second layer, wherein the third layer includes a porous layer, wherein the third layer includes a translucent layer, and wherein the third layer includes a diffusion barrier; fabricating or depositing an amorphous silicon layer on the third layer; and fabricating or depositing a first layer on the amorphous silicon layer, wherein the first layer includes a first semiconductor material including a first conductivity type, and wherein the second conductivity type is opposite the first conductivity type.

In an aspect of the fourth embodiment, the method further includes the step of: texturing the surface of said second layer, wherein the step of texturing is conducted before the step of fabricating or depositing the third layer.

In an aspect of the fourth embodiment, the step of texturing the surface includes acid etching the surface.

In an aspect of the fourth embodiment, the third layer includes a thickness of from about 1 nm to about 50 nm.

In a fifth embodiment of the invention, a method for fabricating a photovoltaic device is provided, the the method including the steps of: providing a second layer including a second semiconductor material including a second conductivity type; fabricating or depositing a fourth layer on the second layer, wherein the fourth layer includes a fourth semiconductor material, wherein the fourth layer includes a porous layer, and wherein the fourth semiconductor material includes a non-doped crystalline silicon semiconductor material; fabricating or depositing a fifth layer on the fourth layer, wherein the fifth layer includes a material selected from the group consisting of amorphous silicon semiconductor material, nanocrystalline semiconductor material, and microcrystalline silicon semiconductor material, wherein the fourth layer and the fifth layer include a same conductivity type; fabricating or depositing a third layer on the fifth layer, the third layer including a third semiconductor material, wherein the third layer includes a porous layer, wherein the third layer includes a translucent layer, and wherein the third layer includes a diffusion barrier; fabricating or depositing an amorphous silicon layer on the third layer; and fabricating or depositing a first layer on the amorphous silicon layer, wherein the first layer includes a first semiconductor material including a first conductivity type, and wherein the second conductivity type is opposite the first conductivity type.

DETAILED DESCRIPTION OF THE PREFERRED EMBODIMENT

The following description and examples illustrate preferred embodiments of the present invention in detail. Those of skill in the art will recognize that there are numerous variations and modifications of this invention that are encompassed by its scope. Accordingly, the description of preferred embodiments should not be deemed to limit the scope of the present invention.

Crystals are referred to herein based on their grain sizes, as provided in Table 1. The term "crystalline silicon" refers to silicon of all crystal types, but excludes amorphous silicon.

TABLE 1

| Grain size of silicon crystal | Name |
| --- | --- |
| Atomic size | Amorphous |
| <10 nm | Nanocrystalline |
| <1 µm | Micro crystalline |
| <100 µm | Polycrystalline |
| <1 mm | Multi crystalline |
| Infinite | Mono crystalline |

In the preferred embodiments, semiconductor materials can include, but are not limited to the following: Silicon (Si), Germanium (Ge), Gallium Phosphide (GaP), Gallium Arsenide (GaAs), Indium Arsenide (InAs), Diamond (C), GaSb: Gallium Antimonide (GaSb), Indium Antimonide (InSb), Indium Phosphide (InP), Gallium Arsenide Antimonide (GaAs$_{1-x}$Sb$_x$), Aluminum Gallium Arsenide (Al$_x$Ga$_{1-x}$As), Gallium Indium Phosphide (Ga$_x$In$_{1-x}$P), Gallium Indium Arsenide (Ga$_x$In$_{1-x}$As), Gallium Indium Antimonide (Ga$_x$In$_{1-x}$Sb), Indium Arsenide Antimonide (InAs$_{1-x}$Sb$_x$), Gallium Indium Arsenide Phosphide (Ga$_x$In$_{1-x}$As$_y$P$_{1-y}$), Gallium Indium Arsenide Antimonide (Ga$_x$In$_{1-x}$As$_y$Sb$_{1-y}$), Gallium Nitride (GaN), Aluminum Nitride (AlN), Indium Nitride (InN), wherein x and y are positive integers. Preferably, the semiconductor material comprises a typical solar cell material such as Si, Ge, or GaAs. More preferably, the semiconductor material is a single elemental semiconductor material such as Si, Ge, or C. Most preferably it is Silicon.

As employed herein, the phrase '... semiconductor material ... based on ...' includes semiconductor materials having impurities (referred to as "dopants" in the art) typically introduced in the semiconductor material during doping procedures, and also includes semiconductor materials having impurities in the semiconductor material that do not result in significant changes in the conductivity properties of the semiconductor material.

Figure 1:
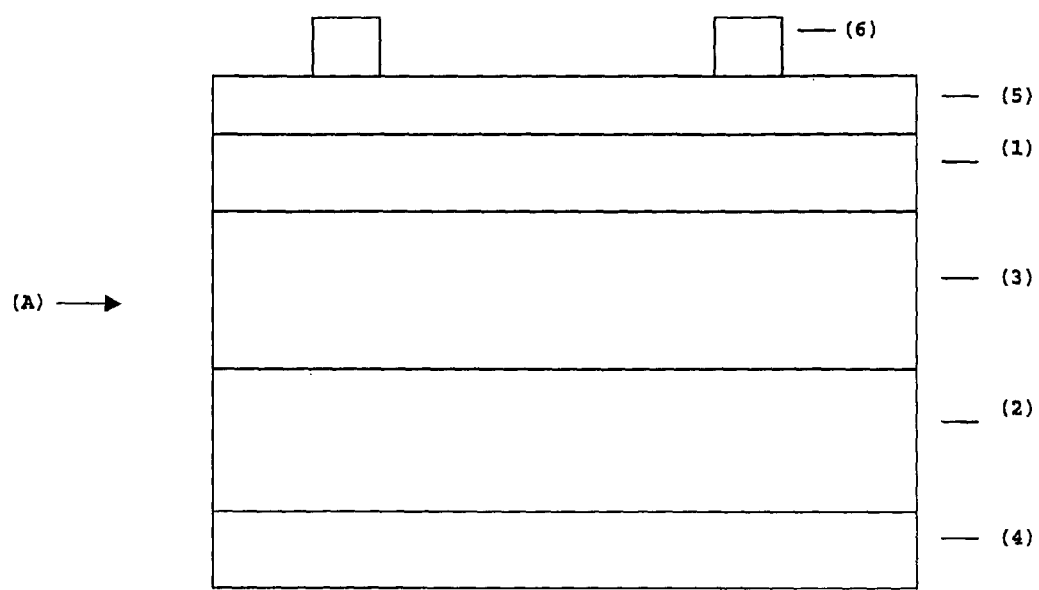
FIG. 1 provides a schematic of a photovoltaic device of a preferred embodiment.

In a preferred embodiment, a photovoltaic device is provided as depicted in FIG. 1, comprising a first layer of a first semiconductor material of a first conductivity type (1), a second layer of a second semiconductor material of the opposite conductivity type (2) to that of the first layer, and a third layer of porous semiconductor material (3) situated between the first layer (1) and the second layer (2). These three layers are preferably physically attached to each other. The first, second, and third semiconductor materials can have the same chemical composition or can have different compositions. Preferably the second and third semiconductor materials have the same chemical composition. Most preferably the second and third semiconductor material are silicon.

In a typical production process, the porous third layer can be fabricated by elaboration of the second layer. The second layer can include, but is not limited to, a wafer or processed wafer. The first layer (referred to as an "emitter layer" in the art) can typically be covered with a conductive electrode layer (5), which can be transparent and can be used for the transport of photon-generated electrons toward the front contacts (6). The conductive electrode layer can be made of, for example, Indium Tin Oxide (ITO), SnO$_2$, or ZnO. On the backside of the second layer (referred to as the "bulk layer" in the art), a back electrode is provided (4), which can be a metal including, but not limited to, Aluminum, Silver, or Nickel. The backside of the bulk layer is defined as the one of the two surfaces of the bulk layer, which is the surface most distant from the third layer.

The term "porous semiconductor material" as used herein is a broad term and is used in its ordinary sense, including, without limitation, a medium comprising semiconductor material and voids, wherein the percentage of the total volume occupied by voids is typically between 10% and 85%. The terms "n-type conductivity" and "p-type conductivity" as used herein are broad terms and are used in their ordinary sense.

In another embodiment, the third layer can be made of porous non-doped semiconductor material. The term "non-doped semiconductor material" as used herein is a broad term and is used in its ordinary sense, including, without limitation, a semiconductor material which has not explicitly been doped or has no characteristics similar to those of such doped materials. Non-doped semiconductor materials are also referred to in the art as "intrinsic semiconductor materials."

In another embodiment, the third layer is made of a porous non-doped semiconductor material comprising a crystalline semiconductor material. In another embodiment, the third layer is made of a porous non-doped silicon semiconductor material comprising a crystalline semiconductor material, such as a monocrystalline silicon semiconductor material or multicrystalline silicon semiconductor material.

The first layer can comprise, for example, an amorphous semiconductor material, a nanocrystalline semiconductor material, or a microcrystalline semiconductor material.

The second layer can comprise, for example, a crystalline semiconductor material, such as a monocrystalline or multicrystalline silicon semiconductor material.

In a particularly preferred embodiment, the second layer includes a multicrystalline silicon semiconductor materials of p-type conductivity, the first layer includes an amorphous silicon semiconductor material of n-type conductivity, and the third layer includes a porous non-doped silicon semiconductor material comprising a multicrystalline semiconductor situated material between the first layer and the second layer.

The thickness of the first layer is preferably from about 3 nm or less to about 100 nm or more, and more preferably from about 4, 5, 6, 7, 8, 9, or 10 nm to about 20, 30, 40, 50, 60, 70, 80, or 90 nm. The thickness of the third layer is preferably from about 1 nm or less to about 50 nm or more, and more preferably from about 2, 3, 4, 5, 6, 7, 8, 9, or 10 nm to about 15, 20, 25, 30, 35, 40, or 45 nm. The second layer can be of any suitable thickness, such as is typically associated with bulk layers.

FIG. 3, FIG. 4, FIG. 5 and FIG. 6 are provide measurements of typical solar cell parameters, including, respectively the short circuit current $J_{sc}$ (mA/cm$^2$), the open circuit voltage $V_{oc}$ (mV), the efficiency $\eta$ (%), and the fill factor FF (%), based on typical but specific layer thicknesses for the emitter layer and the bulk layer, for both a reference device and, as discussed below, for different thicknesses of the porous layer, including 16 nm, 24 nm, and 36 nm.

Example 1

A multicrystalline Silicon substrate (marketed by Deutsche Solar GmbH under the tradename BAYSIX®, carrier concentration of about $10^{16}$ cm$^{-3}$), upon which a porous layer was electrochemically elaborated, the porous layer having a thickness of about 15 to 20 nm and a porosity of about 20%. The remaining non-porous part of the wafer was p-doped. A Plasma Enhanced Chemical Vapor Deposition (PECVD) process was used to deposit an amorphous silicon layer on top with a thickness of about 10 to 15 nm, which was hydrogenated and n-doped (carrier concentration of about $10^{19}$ cm$^{-3}$).

The results indicate that an optimal porous layer thickness is preferably about 16 nm, with efficiency decreasing at lesser or greater thicknesses, and also indicate that the fabrication method is suitable for preparing porous layers having a thickness of about 1 nm to about 50 nm at typical emitter thicknesses, namely, about 3 nm to about 100 nm.

The efficiency observed was higher than that of a prior art reference device, wherein non-doped amorphous silicon was used for the third layer, as illustrated in Table 2. The reference device consisted of a p-doped multi crystalline Silicon wafer (marketed by Deutsche Solar GmbH under the tradename BAYSIX®, carrier concentration of about $10^{16}$ cm$^{-3}$), upon which a 5 nm thick layer of intrinsic amorphous silicon was deposited via a PECVD technique. Another PECVD process was used to deposit an amorphous silicon layer on top with a thickness of about 10 to 15 nm, which was hydrogenated and n-doped (carrier concentration of about $10^{16}$ cm$^{-3}$).

TABLE 2

|  | $V_{oc}$ (mV) | $J_{sc}$ (mA/cm$^2$) | FF (%) | $\eta$ (%) |
|---|---|---|---|---|
| Invention | 579 | 32.63 | 75 | 14.2 |
| Amorphous non-doped silicon as thin film layer | 572.0 | 30.08 | 76.6 | 13.2 |

Example 2

A p-type, 10×10 cm$^2$ standard commercial substrate of Czochralski growth silicon (CZ Si) was used. Resistivity of the substrate was from about 1 to 2 Ωcm and the crystallographic orientation was <100>. As a first step, the sawing damage of as-received wafers was removed by chemical etching using a chemical solution based on a HF:HNO$_3$ acid mixture. Either a CP133 solution was employed, which resulted in polishing of the Si surface, or isotropic acid texturing was employed, which resulted in the surface texturization.

Porous silicon layers on the surface of wafers are produced in a standard Teflon cell using HF:acetic acid solution by anodization at a very low current densities less then 5 mA/cm$^2$ for a few seconds. Electrochemical reactions at these conditions provides the formation of porous Si layers with a very low porosity of 15-20% and the thickness in the range of 5-10 nm as measured by spectroscopic ellipsometry.

Table 3 provides a listing of the wafers which were prepared prior to the amorphous Si:H (a-Si:H) layer deposition. After deposition, a standard RCA-I cleaning step (a 4:1 mixture of sulfuric-acid:hydrogen peroxide mixture at 80° C. for 15 min) with subsequent rinsing in deionized (DI) water was conducted for all samples. Finally, before the insertion of wafers into the PECVD chamber they were dipped in HF (1%) for one minute.

TABLE 3

| Sample Number | Surface treatment | Porous Si thickness (nm) | Porous Si porosity (%) |
|---|---|---|---|
| D0 | Polished | 0 | 0 |
| D1 | Polished | 5 | 15 |
| D2 | Polished | 10 | 20 |
| A0 | Textured | 0 | 0 |
| A1 | Textured | 5 | 15 |
| A2 | Textured | 5 | 25 |
| A3 | Textured | 10 | 15 |
| A4 | Textured | 10 | 25 |

Intrinsic a-Si:H layers with a thickness of 5 nm were deposited using 40 sccm flow rate for SiH$_4$ at a 230° C. substrate temperature in a conventional PECVD set-up with the following parameters: 13.56 MHz frequency, 4.3 W power, and 300 mTorr as a deposition pressure. Deposition of the n-type a-Si:H with a thickness of 5 nm was also conducted at a 230° C. substrate temperature, 24 sccm flow rate of SiH$_4$, and 12 sccm of PH$_3$ diluted in SiH$_4$ (1% PH$_3$ in SiH$_4$).

ITO was deposited using a DC magnetron system with ITO target in argon ambient. The argon flow rate was 38 sccm and the DC plasma power was 100 W. Since an increase in the ITO deposition temperature lead to a decrease in the solar cell efficiency, ITO deposition was conducted at room temperature.

The front side (Cr/Ag, 30 nm/4 μm) and back side (Al, 2 μm) metallization processes were conducted with an e-gun evaporation system. The heating during the metal evaporation did not exceed ~80° C.

A simple solar cell structure consisting of a metal grid/ITO/(n)a-Si:H/(i)a-Si:H/(p)Cz—Si/Al was fabricated. Nine 1×1 cm$^2$ test solar cells were fabricated on each (10×10 cm$^2$) wafer. Separation of test solar cells was achieved using a CO$_2$ laser.

Figure 7:
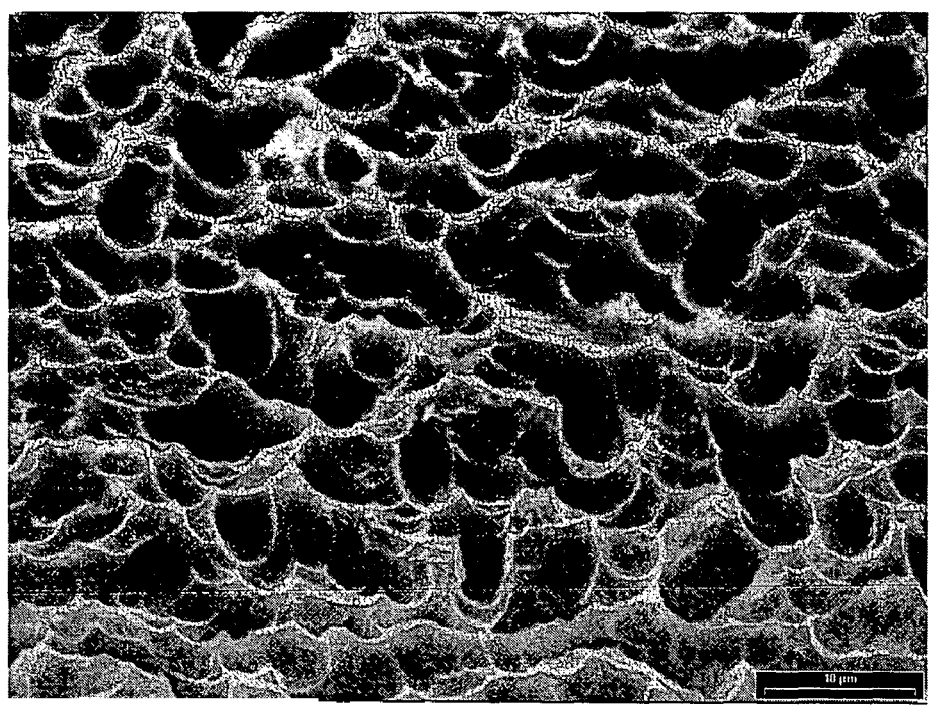
FIG. 7 provides a Scanning Electron Micrograph of an acid textured CZ—Si surface.

FIG. 7 shows a Scanning Electron Micrograph of the acid textured surface of p-type Cz—Si. Such a chemical treatment results in the formation of etch pits which are uniformly distributed over the whole surface. One of the advantages of the acid texturing is the formation of very fine etch pits with a diameter smaller than one micron within the macro-etch pits. Such a surface serves as a superior template for further deposition of amorphous silicon (a-Si) than does an alkaline textured surface. Moreover, this surface provides better light trapping than an alkaline textured surface.

Figure 8:
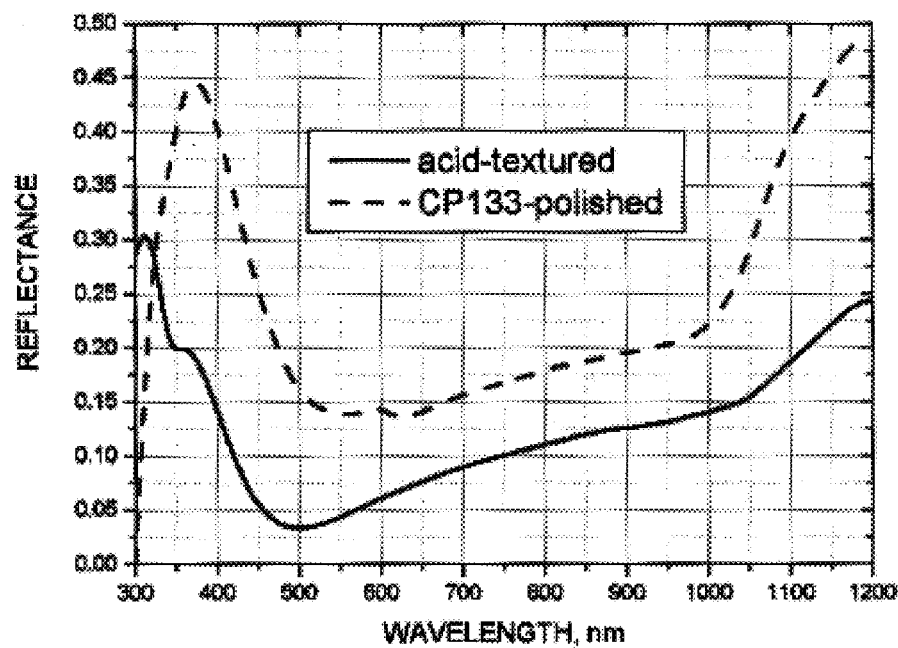
FIG. 8 provides reflectance characteristics of the solar cells prepared on acid-textured and CP133 polished surfaces.

FIG. 8 provides the reflectance characteristics of fully finished heterojunction solar cells performed on the acid textured and chemically polished surfaces. The integral reflectance of the acid textured surface was 10% less than that of the polished surface (9.7% versus 19.5%). Particularly low reflectance was observed between 400 and 700 nm. This is most likely the main reason for the improvement of the heterojunction solar cell characteristics fabricated on acid-textured substrates as compared to those on CP133 polished samples. Table 4 provides a summary of photovoltaic output parameters of these solar cells (0.98 cm$^2$ heterojunction solar cells processed on p-type Cz—Si substrates with different surface treatments).

TABLE 4

| Wafer | $J_{sc}$ (mA/cm$^2$) | $V_{oc}$ (mV) | FF (%) | η (%) |
| --- | --- | --- | --- | --- |
| D0 | 30.07 | 594 | 77.8 | 14.0 |
| D1 | 30.93 | 596 | 78.6 | 14.5 |
| D2 | 30.71 | 592 | 77.8 | 14.2 |
| A0 | 32.54 | 583 | 76.4 | 14.5 |
| A1 | 33.42 | 589 | 77.5 | 15.2 |
| A2 | 33.00 | 587 | 77.5 | 15.0 |
| A3 | 33.54 | 591 | 76.0 | 15.0 |
| A4 | 33.81 | 591 | 77.6 | 15.2 |

Data in Table 4 represents the average results of nine solar cells on each 10×10 cm$^2$ wafer. The set of acid textured samples showed a higher short circuit current (due to the lower reflectance and the higher light trapping) and a lower open circuit voltage.

Figure 9:
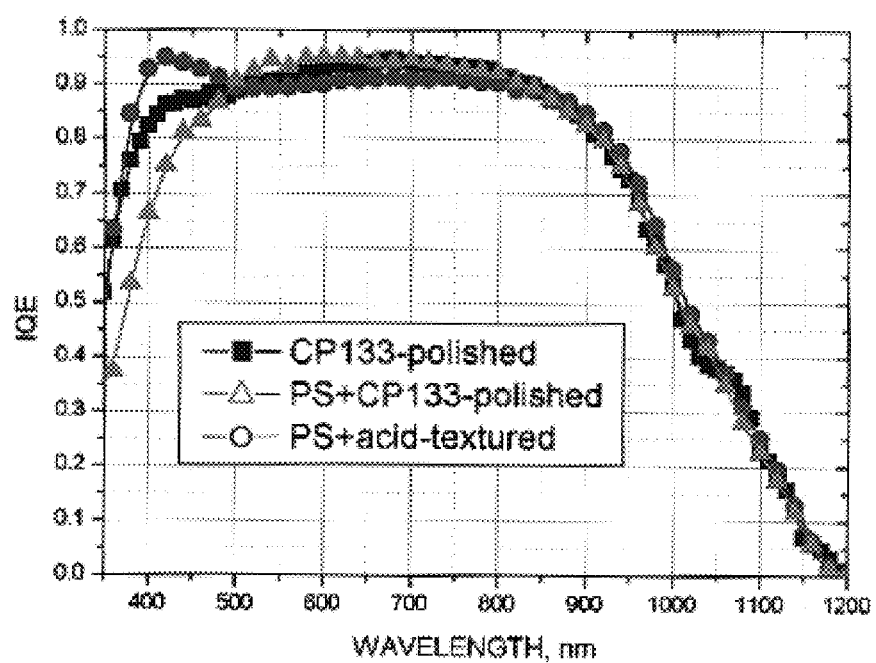
FIG. 9 provides the Internal Quantum efficiency (IQE) of typical heterojunction solar cells on polished and textured substrates.

It is believed that the reduction of $V_{OC}$ is due to an increase of the surface recombination velocity on the textured surface, or is due to the formation of a less satisfactory p-n junction during the deposition of a very thin amorphous emitter on a macro-rough surface. In order to investigate these hypotheses, IQE-analysis was applied to heterojunction solar cells. FIG. 9 shows the IQE-curves of typical solar cells prepared on textured and polished substrates. The IQE of all cells was almost identical in the visible and infrared regions, while in the short wavelength region (350-500 nm) there is a significant difference in IQE. Peak IQE, observed for the cells prepared on an acid-textured substrate, cannot be attributed to the texturization itself because similar peaks were observed after low-temperature heating of heterojunction solar cells fabricated on polished substrates. It is believed that the hydrogen which is incorporated during the texturization in the micro-pores diffuses during the solar cell processing and improves properties of near the heterojunction region. It is clear that the acid texturization of the surface does not give rise to surface recombination velocity and therefore the lower $V_{oc}$ could be attributed to the non-ideal p-n junction profile due to the non-homogeneous deposition of a thin a-Si layer on the textured surface.

As can be ascertained from Table 5, the presence of a porous Si layer, independent from the mode of substrate preparation, lead to the enhancement of short circuit current. On the textured cells, the same trend was clearly observed for the open circuit voltage. Moreover, the enhancement of the $V_{oc}$ was correlated with an increase in the thickness of porous Si layer for devices with an intrinsic a-Si layer. The same correlation of $V_{oc}$ and thickness of the porous Si intermediate layer was also observed for multicrystalline Si devices without the a-Si intrinsic layer. This confirms that porous Si as an additional barrier effectively prevents the diffusion of In/Sn from ITO into the substrate during solar cell processing. Replacement of a porous Si buffer by a thicker intrinsic layer reduces desirable characteristics of heterojunction solar cells due to the amorphous nature of this layer.

A slight increase in the porosity of the layer does not influence on $V_{oc}$ because while an increase in porosity leads to an increase in the gettering sites, it also increases diffusion along the pores. As a result, significant differences are not observed in the photovoltaic characteristics of the cells with an increase of the porosity of porous Si barrier layers.

The cells prepared on polished surface show superior characteristics. It is noted that the behavior of a porous Si buffer layer is different for textured and non-textured surface as can be derived from IQE-curves in, as shown in FIG. 9.

Figure 10:
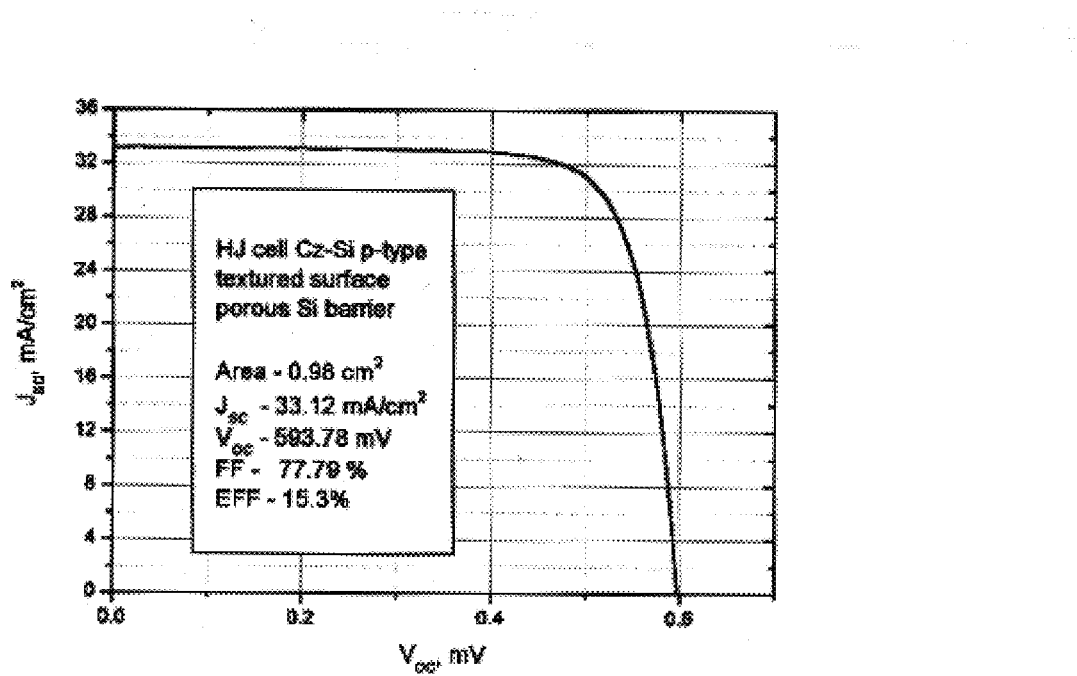
FIG. 10 provides current-voltage characteristics of a cell with porous Si barrier performed on the textured surface.

The best heterojunction solar cell from this set of experiment was prepared on an acid-textured substrate with a porous Si intermediate layer of about 10 nm thickness and a porosity of 20%. The I-V characteristics of this cell are plotted in FIG. 10.

Non-doped porous silicon based on crystalline silicon was observed to have electrical characteristics (carrier concentration of from about $10^{12}$ cm$^{-3}$ to $10^{13}$ cm$^{-3}$) similar to those of non-doped amorphous silicon (carrier concentration of about $10^{11}$ cm$^{-3}$). More precisely, non-doped porous silicon is not conductive, but has lower absorption characteristics then amorphous silicon, which is preferred since the area for photogeneration of the carriers is located below the thin film layer, in this case porous silicon layer. High transparency of the porous layer is preferred. The porous layer is preferably translucent. Non-doped amorphous silicon absorbs more light than does amorphous silicon, which suggests that the preferred embodiments can employ a thicker third layer (referred to as a "thin film layer" in the art), improving robustness against diffusion of indium atoms moving from the ITO into the bulk material. In other words, the layer of non-doped porous silicon based on crystalline silicon functions as a diffusion barrier.

Porous silicon is intrinsically hydrogen (H) rich, increasing passivation. Since grain boundaries between neighboring single crystals in a multicrystalline layer also increase recombination activity of the cell, these layers are preferably passivated. In the presence of Aluminum (Al), typically used as electrode material, H atoms moving from the porous silicon diffuse more quickly through the multicrystalline silicon, and an improved passivation of the bulk material is achieved. See "Synergetic effect of Aluminum and thermally treated porous silicon for bulk passivation of multi crystalline silicon," to Bilyalov, et al., Conference Record of the Twenty-Eighth IEEE Photovoltaic Specialists Conference-2000, Cat. No. 00CH37036, xxxii+1838, pp. 291-4.

Porous silicon can be prepared by electrochemical etching or chemical etching. A second characteristic of the devices of preferred embodiments is that after the production of the porous layer by elaboration of the second layer, no extra plasma-cleaning step is required before adding the amorphous emitter layer on top, which would be needed if a non-doped amorphous silicon thin film was employed as a third layer. Moreover, in the latter case a wet cleaning step is required before the PECVD process that deposits, for example, the non-doped amorphous silicon thin film, which suggests that the deposition of electrode material on the backside, typically Aluminum, can only be performed after the wet cleaning process, thus contaminating the front surface. In the case of a non-doped porous thin film where the porous layer is made via electrochemical etching, this contamination is removed during the production process.

Figure 2:
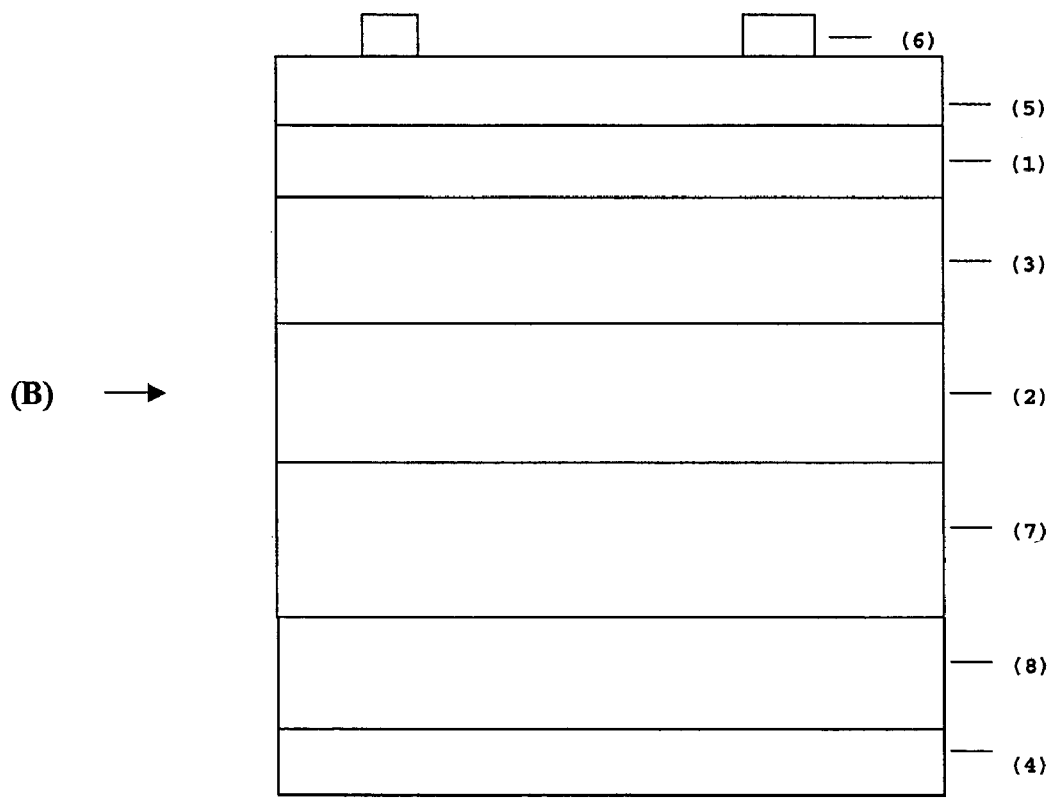
FIG. 2 provides a schematic of a photovoltaic device of a preferred embodiment.
Figure 3:
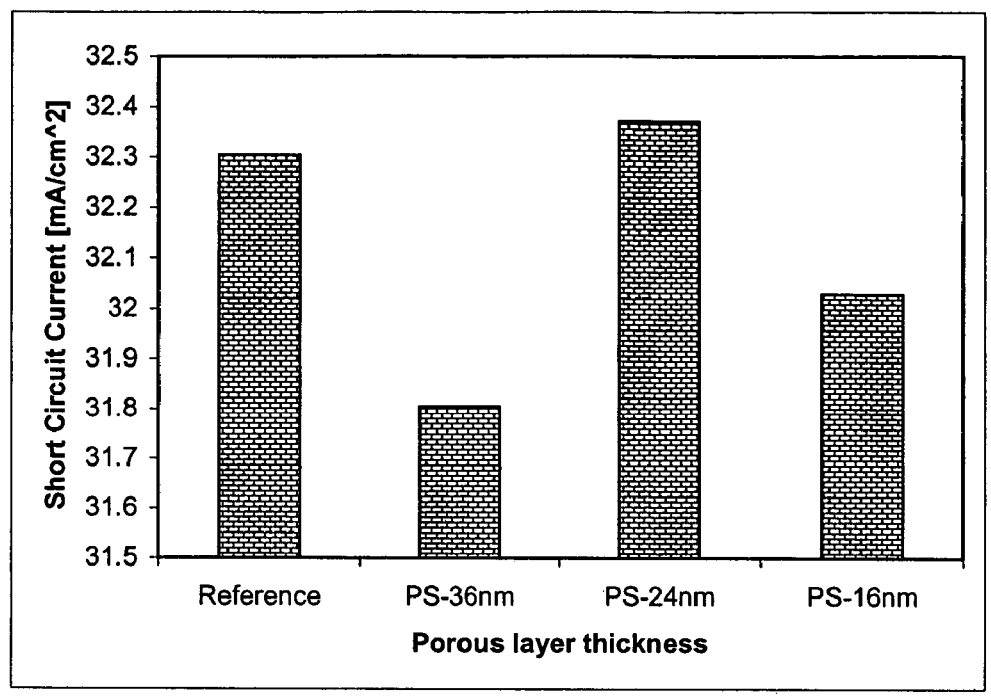
FIG. 3 provides a graph depicting the relationship between short circuit current (mA/cm$^2$) and the thickness of porous layer.
Figure 4:
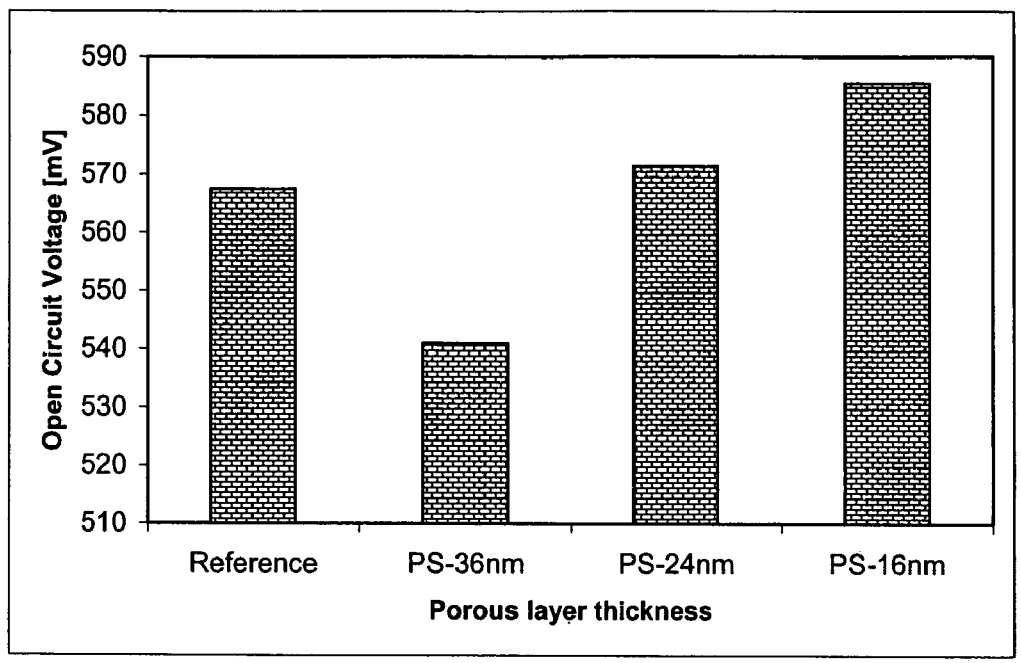
FIG. 4 provides a graph depicting the relationship between open circuit voltage (mV) and thickness of the porous layer.
Figure 5:
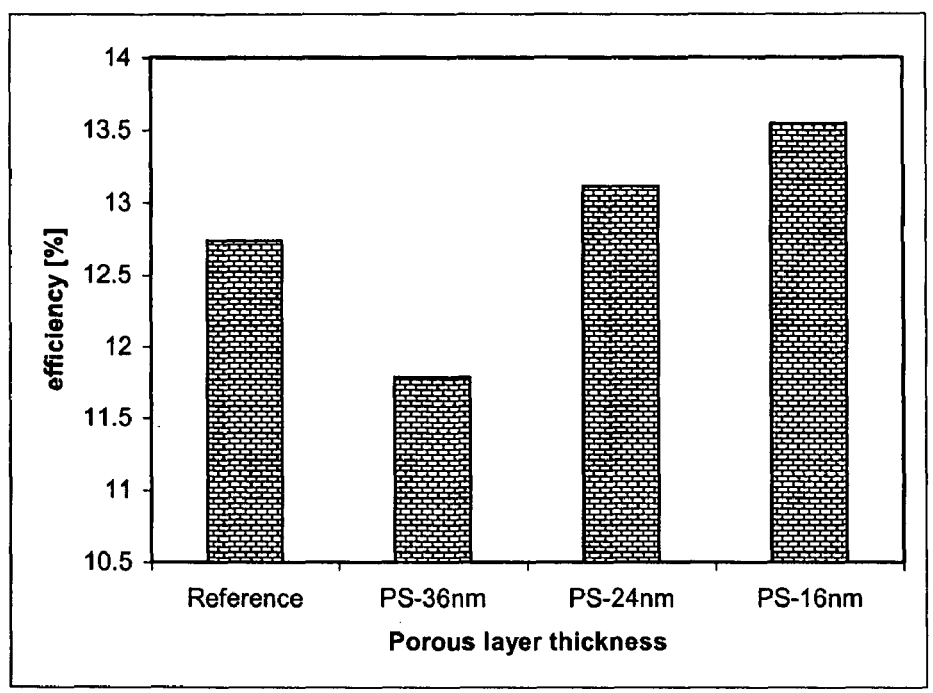
FIG. 5 provides a graph depicting the relationship between efficiency (%) and thickness of the porous layer.
Figure 6:
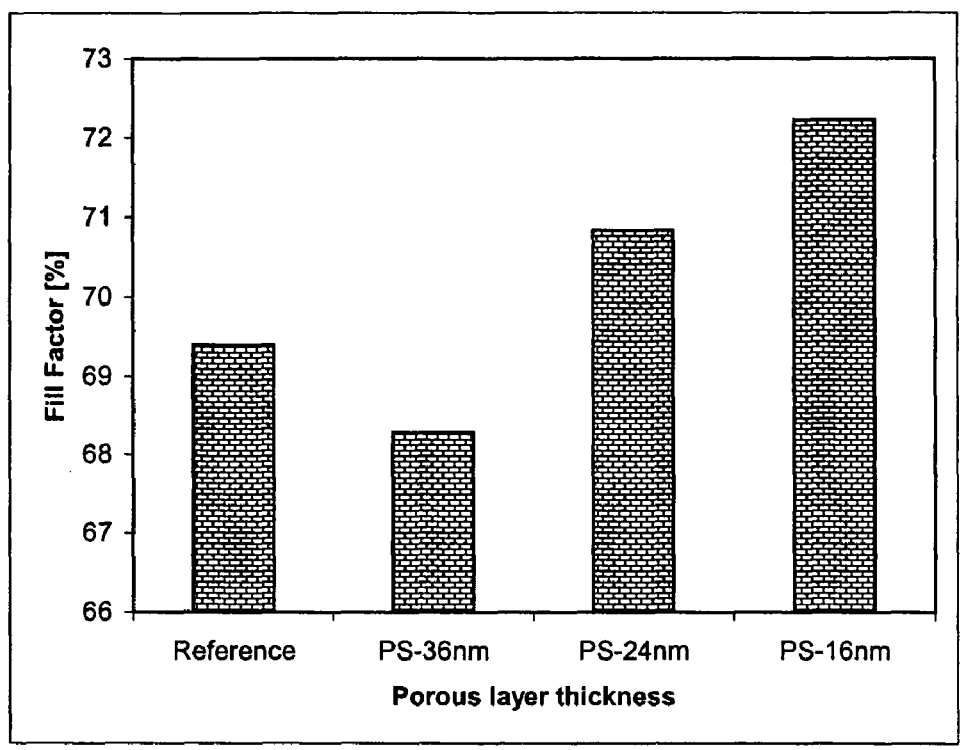
FIG. 6 provides fill factor [%] values for different values of porous layer thickness.

In forming a porous layer by chemical etching, such as in the production of the device represented in FIG. 2, wherein the multicrystalline or monocrystalline bulk layer is covered with porous silicon material on both sides, a simpler method is possible since both porous layers can be formed simultaneously.

The photovoltaic device of FIG. 2B, wherein the second layer of the device of FIG. 1A is further attached to a fourth layer (7) made of a porous non-doped silicon semiconductor material comprising a crystalline semiconductor material, which is in turn attached to a fifth layer (8) comprising an amorphous silicon semiconductor material of the same conductivity type as the second layer, is similar to the photovoltaic cell construction as discussed in "High-efficiency a-Si/c-Si heterojunction solar cell," Sawada, et al., First World Conference on Photovoltaic Energy Conversion, Hawaii, 1994, pp. 1219-1226.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims. All patents, applications, and other references cited herein are hereby incorporated by reference in their entirety.

What is claimed is:

1. A photovoltaic device, the device comprising:
    a first layer comprising an amorphous silicon semiconductor material of n-type conductivity;
    a second layer comprising a crystalline silicon semiconductor material of p-type conductivity; and
    a third layer comprising a non-doped semiconductor material, wherein the third layer is situated between and contacts the first layer and the second layer, and wherein the third layer is a translucent porous layer and diffusion barrier having a thickness of from about 1 nm to about 50 nm,
    a fourth layer, wherein the second layer is attached to the fourth layer, wherein the fourth layer comprises a porous layer comprising a fourth semiconductor material, and wherein the fourth semiconductor material comprises non-doped crystalline silicon semiconductor material,
    a fifth layer, wherein the fourth layer is attached to the fifth layer, wherein the fourth layer and the fifth layer comprise a same conductivity type, and wherein the fifth layer comprises a material selected from the group consisting of amorphous silicon semiconductor material, nanocrystalline semiconductor material, and microcrystalline silicon semiconductor material.

2. The photovoltaic device according to claim 1, wherein the photovoltaic device comprises a device selected from the group consisting of a photodiode, a photoresistor, and a solar cell.

3. The photovoltaic device according to claim 1, wherein the third semiconductor material comprises a crystalline semiconductor material.

4. The photovoltaic device according to claim 1, wherein the third layer comprises a material selected from the group consisting of a multicrystalline semiconductor material and a monocrystalline semiconductor material.

5. The photovoltaic device according to claim 1, wherein the second layer comprises a monocrystalline semiconductor material.

6. The photovoltaic device according to claim 1, wherein the second layer comprises a multicrystalline semiconductor material.

7. The photovoltaic device according to claim 1, wherein the first layer has a thickness of from about 3 nm to about 100 nm.

8. The photovoltaic device according to claim 1, further comprising an amorphous silicon layer, wherein the amorphous silicon layer is situated between the first layer and the third layer.

9. The photovoltaic device according to claim 1, wherein the second layer comprises a plurality of macro etch pits comprising a diameter of greater than about one micron, and wherein a portion of the macro etch pits comprise a plurality of fine etch pits comprising a diameter of less than about one micron.

10. The photovoltaic device according to claim 1, wherein the third layer comprises a porous semiconductor material comprising a semiconductor material and voids, wherein a percentage of a total volume occupied by voids is from 10% to 85%.

11. The photovoltaic device according to claim 1, wherein the third layer consists of a porous non-doped monocrystalline silicon semiconductor material.

12. The photovoltaic device according to claim 1, wherein the third layer consists of a porous non-doped multicrystalline silicon semiconductor material.

13. The photovoltaic device according to claim 1, wherein the third layer consists of a porous layer.

14. The photovoltaic device according to claim 1, wherein the third layer consists of a translucent layer.

15. The photovoltaic device according to claim 1, wherein the third layer consists of a porous translucent layer that acts as a diffusion barrier.

16. The photovoltaic device according to claim 1, wherein the third layer comprises a porous layer of high transparency.

17. The photovoltaic device according to claim 1, wherein the third layer consists of a transparent porous layer.

18. The photovoltaic device according to claim 1, wherein the third layer consists of silicon.

19. The photovoltaic device according to claim 1, wherein the third layer consists of germanium.

20. The photovoltaic device according to claim 1, wherein the third layer consists of carbon.

21. The photovoltaic device according to claim 1, wherein the third layer is a single translucent porous layer.

22. The photovoltaic device according to claim 1, wherein the third layer consists of a single semiconductor element.

23. The photovoltaic device according to claim 1, wherein the third layer comprises silicon.

24. The photovoltaic device according to claim 1, wherein the third layer comprises germanium.

25. The photovoltaic device according to claim 1, wherein the first layer, the second layer, and the third layer together constitute a heterojunction with intrinsic thin-layer cell.

26. The photovoltaic device according to claim 1, wherein the first layer consists of an amorphous silicon semiconductor material of n-type conductivity, wherein the second layer consists of a crystalline silicon semiconductor material of p-type conductivity; and wherein the third layer consists of a porous, translucent semiconductor material.

27. The photovoltaic device according to claim 1, wherein the third layer has a porosity of from 15% to 20% and a thickness of from 5 nm to 10 nm as measured by spectroscopic ellipsometry.

* * * * *